United States Patent [19]
Mihara

[11] Patent Number: 5,562,775
[45] Date of Patent: Oct. 8, 1996

[54] PLASMA DOWNSTREAM PROCESSING

[75] Inventor: Satoru Mihara, Kawasaki, Japan

[73] Assignee: Fujitsu Limited, Kawasaki, Japan

[21] Appl. No.: 498,347

[22] Filed: Jul. 5, 1995

[30] Foreign Application Priority Data

Aug. 12, 1994 [JP] Japan .................................. 6-190212

[51] Int. Cl.$^6$ .................................................. C23C 16/00
[52] U.S. Cl. .............................. 118/725 MW; 156/345; 204/298.38; 118/723 ME
[58] Field of Search .................. 156/345; 118/723 MW, 118/723 ME, 723 MA, 723 MR, 723 MP; 204/298.38; 134/1.1, 1.2

[56] References Cited

U.S. PATENT DOCUMENTS

| | | | |
|---|---|---|---|
| 4,718,976 | 1/1988 | Fujimura | 156/643 |
| 4,983,254 | 1/1991 | Fujimura et al. | 156/643 |
| 4,987,284 | 1/1991 | Fujimura et al. | 219/121.43 |
| 5,024,182 | 6/1991 | Kobayashi et al. | 118/723 |
| 5,284,544 | 2/1994 | Mizutani et al. | 156/345 |
| 5,480,533 | 1/1996 | Yoshida | 204/298.19 |

FOREIGN PATENT DOCUMENTS

7-29885  1/1995  Japan .

*Primary Examiner*—R. Bruce Breneman
*Assistant Examiner*—Joni Y. Chang
*Attorney, Agent, or Firm*—Armstrong, Westerman, Hattori, McLeland & Naughton

[57] ABSTRACT

An apparatus for performing plasma downstream processing comprises: a microwave introduction chamber defined by a wall having a microwave transmitting window formed of a microwave transmissive material at a part thereof; a plasma generating chamber facing to said microwave introduction chamber through said microwave transmitting window and having a conductive microwave shield disposed generally parallel to said microwave transmitting window, to define a plasma generating space, said microwave shield including a central member which is formed of a continuous conductor and an outer member disposed outside the central member through a gap which has a folded cross sectional shape in a plane including a central normal to the microwave transmitting window; and an evacuatable processing chamber disposed adjacent to said plasma generating chamber through said microwave shield. The gap formed between the central member and the outer member can have a large cross section compared to the conventional through holes in the punching metal. Folded configuration of the gap can prevent direct passing-through of charged particles through microwave shield. A reliable and fast ashing process can be realized.

8 Claims, 6 Drawing Sheets

PLASMA DOWNSTREAM PROCESSING

BACKGROUND OF THE INVENTION

1. Field of the Invention

This invention relates to a plasma downstream processing apparatus and a plasma downstream processing method, and more particularly to a plasma downstream processing apparatus and a plasma downstream processing method adapted for ashing an organic resist or for isotropic etching process used in manufacture of a semiconductor device, and having a high processing speed and giving less damage to the object to be processed.

2. Description of the Related Art

Recently, such a plasma downstream processing technique which can perform the processing at a high precision and give less damage to the substrate to be processed is increasingly demanded along with the high integration of a semiconductor integrated circuit device.

More specifically, high processing speed and less damage in the object to be processed is demanded in an ashing process for an organic resist and in an etching process for an insulating film. Plasma downstream processing would be promising in this regard.

Figure 4:
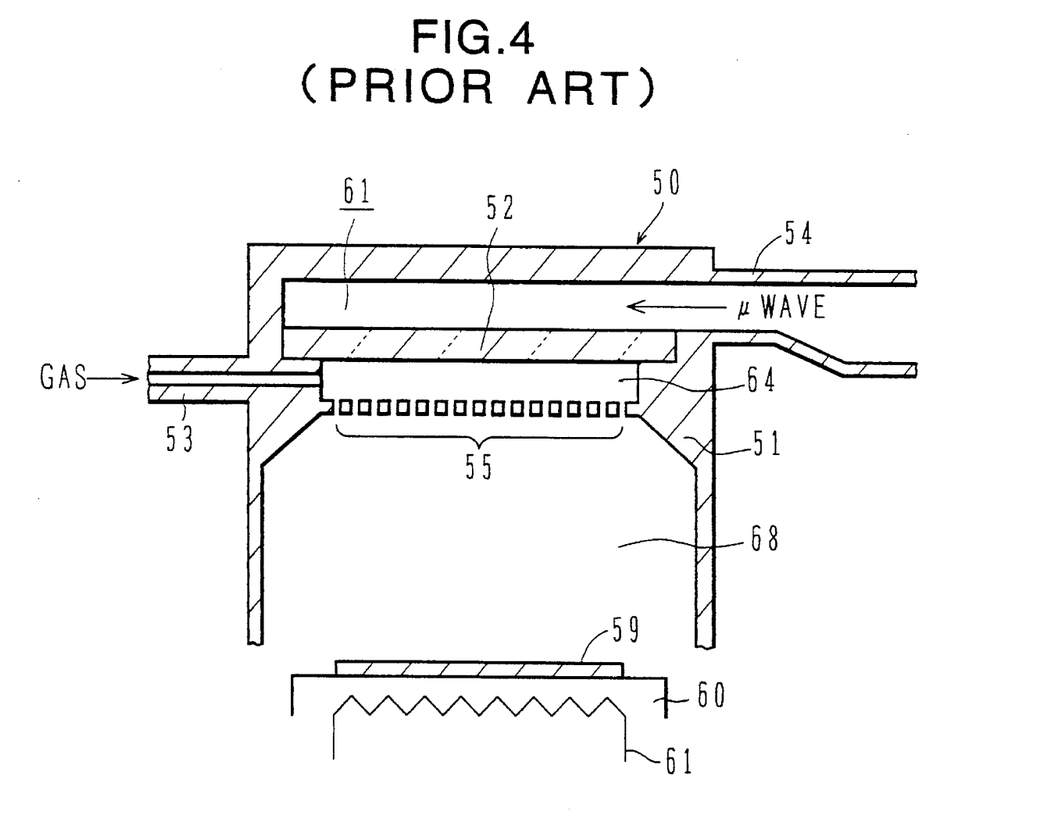
FIG. 4 is a cross sectional view of an ashing apparatus of shower head type without quartz cover according to the conventional art.

FIG. 4 shows a conventional shower head type ashing apparatus. An ashing apparatus 50 comprises an aluminum housing 51 which defines an inner space. A microwave transmitting window 52 made of quartz is disposed in the housing 51 and hermetically couples to the inner surface of the housing, to define a microwave Introduction chamber 61 thereabove. A waveguide 54 for transmitting microwave is connected to the microwave Introduction chamber 61 and supplies microwave thereto.

The housing 51 and the microwave transmitting window 52 define an evacuatable hermetic space below the microwave transmitting window 52. A shower head 55 is disposed parallel to the microwave transmitting window 52 and coupled to the inner wall of the housing 51. A plasma generating chamber 64 is defined between the microwave transmitting window 52 and the shower head 55. A gas supply tube 53 is connected to the plasma generating chamber 64. A downstream processing chamber 68 is defined in the housing 51 below the shower head 55. The downstream processing chamber 68 contains a susceptor 60 which is provided with a heater 61.

Most of the constituent parts of the ashing apparatus 50, except the microwave transmitting window 52 and sealing members, are formed of aluminum. A substrate 59 to be processed, such as silicon wafer having an organic resist film thereon is mounted on the susceptor 60.

An $O_2$ containing gas is introduced from the gas introducing tube 53 to the plasma generating chamber 64 and microwave is introduced from the waveguide 54 through the microwave introduction chamber 61 to the plasma generating chamber 64, to generate plasma of the $O_2$ containing gas.

By the action of the plasma, oxygen radicals, which are the neutral and reactive species, together with electrons and ions are generated. These oxygen radicals are to be introduced into the processing chamber 68 through the shower head 55. The introduced oxygen radicals are transported downward and irradiated onto the surface of the substrate 59 mounted on the susceptor 60. The organic resist film coated on the substrate 59 is ashed by the irradiated oxygen radicals.

The shower head 55 is formed of a metal plate having a multiplicity of through holes, and is usually called a punching metal. Each through hole has a diameter of about 1 mm and a length (thickness) of the order of 2–3 mm. The $O_2$ containing gas cannot go above the microwave transmitting window 52. The microwave cannot enter below the shower head 55. Since the through holes in the shower head 55 is small in diameter, plasma generated in the plasma generating chamber 64 is confined in the chamber 64 and cannot enter the processing chamber 68. Charged particles such as electrons and ions also confined in the plasma generating chamber.

Except the microwave transmitting window 52, most of the plasma generating chamber and the processing chamber are formed of aluminum which is a metal capable of shielding microwave and generating no contamination. During the ashing treatment, the inner wall of the ashing chamber 68 becomes 200°–300° C. due to the influence of the plasma in the plasma generating chamber 64, and the shower head 55 becomes hotter.

When the temperature of the metal inner surfaces of the respective chambers becomes hot, the possibility of annihilating oxygen radicals by the collision with the inner wall increases. Therefore, the radical concentration decreases and the ashing rate decreases. The decrease in the ashing rate also means a variation in the ashing rate and accompanies a decrease in the controlling accuracy.

SUMMARY OF THE INVENTION

An object of this invention is to provide a plasma downstream processing apparatus which can afford a high processing speed, less variations in the processing speed, and less damage to the object to be processed.

Another object of this invention is to provide a plasma downstream processing method which gives less damage to the object to be processed, and a high processing speed.

According to an aspect of this invention, there is provided an apparatus for performing plasma downstream processing comprising: a microwave introduction chamber defined by a wall having a microwave transmitting window formed of a microwave transmissive material at a part thereof; a plasma generating chamber facing to said microwave introduction chamber through said microwave transmitting window and having a conductive microwave shield disposed generally parallel to said microwave transmitting window, to define a plasma generating space, said microwave shield including a central member which is formed of a continuous conductor and an outer member disposed outside the central member through a gap which has a folded cross sectional shape in a plane including a central normal to the microwave transmitting window; and an evacuatable processing chamber disposed adjacent to said plasma generating chamber through said microwave shield.

Part of the inner surface of the plasma generating chamber, particularly at the area where the plasma density is high may be coated with quartz.

According to another aspect of this invention, there is provided a method of performing plasma downstream processing, comprising the steps of: generating plasma of an oxygen-containing gas with a microwave, in a space having a thickness of $1/10$ or less of a wavelength $\lambda$ of the microwave; deriving the gas from opening formed around the central portion of said plasma through a gap, which gap has a loop-shaped cross section in a plane parallel to said space, and a folded cross section in a plane including a central normal to said space; irradiating the derived gas to an object to be processed.

It has been experimentally found that the use of a microwave shield having a gap comprising a cylindrical part and a folded part can effectively transmit radicals and prevent passage of charged particles.

A portion of plasma in the plasma generating chamber, that is the portion where the microwave electric field is high, is shielded by a continuous central conductive member. Thus, the plasma can be effectively confined in the plasma generating chamber. Also, the cylindrical gap can have a sufficiently wide width to enhance the transportation efficiency of radicals. Therefore, the processing speed can be enhanced without giving damages to the substrate to be processed.

By coating the inner surface of the plasma generating chamber with a quartz layer at least partially, the annihilation of oxygen radicals can be reduced even when the temperature of the inner wall is raised, and variation or decrease of the processing speed can be decreased. It is particularly effective when the processing uses no fluorine containing gas. Effective ashing of an organic resist is realized by using one of ashing gases $O_2$, $O_2+H_2O$, and $O_2+N_2$, and by coating the inner surface of the plasma generating chamber with a quartz layer.

BRIEF DESCRIPTION OF THE DRAWINGS

FIGS. 1A to 1F show an ashing apparatus according to the first embodiment of this invention, using no quartz cover, wherein FIGS. 1A to 1C, 1E and 1F are cross sectional views and FIG. 1D is a schematic perspective view.

DESCRIPTION OF THE PREFERRED EMBODIMENTS

Figure 1A:
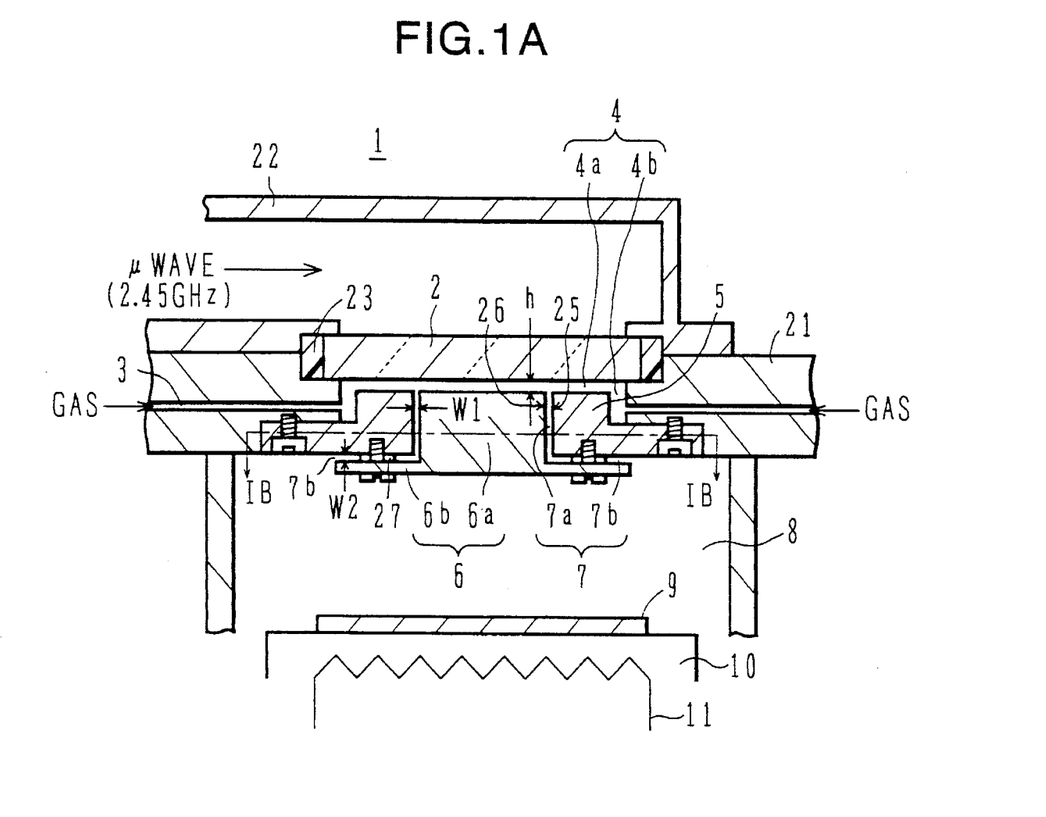

FIGS. 1A to 1F show an ashing apparatus according to an embodiment of this invention. FIG. 1A is a longitudinal cross section. An ashing apparatus comprises a microwave introduction chamber 1 for introducing microwave from a waveguide 22, a plasma generating chamber 4 for generating plasma of a gas introduced frown a gas supply tube 3, a microwave transmitting window 2 made of quartz for hermetically separating the microwave generating chamber 4 from the microwave introduction chamber 1, an ashing chamber 8 containing a susceptor 10 with a heater 11 for carrying a substrate 9 to be processed, and a microwave shield 5 and 6 for separating the ashing chamber 8 from plasma generating chamber 4, shielding the microwave and charged particles, and allowing passage of neutral particles.

Figure 1B:
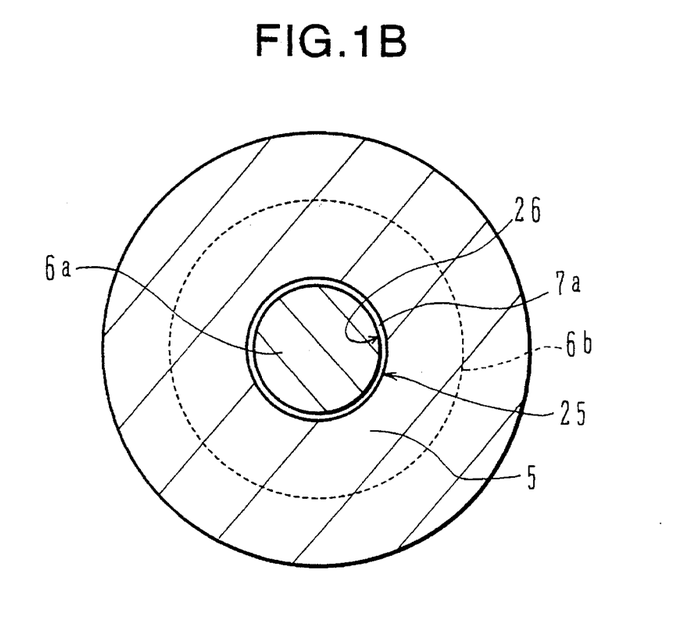
Figure 1C:
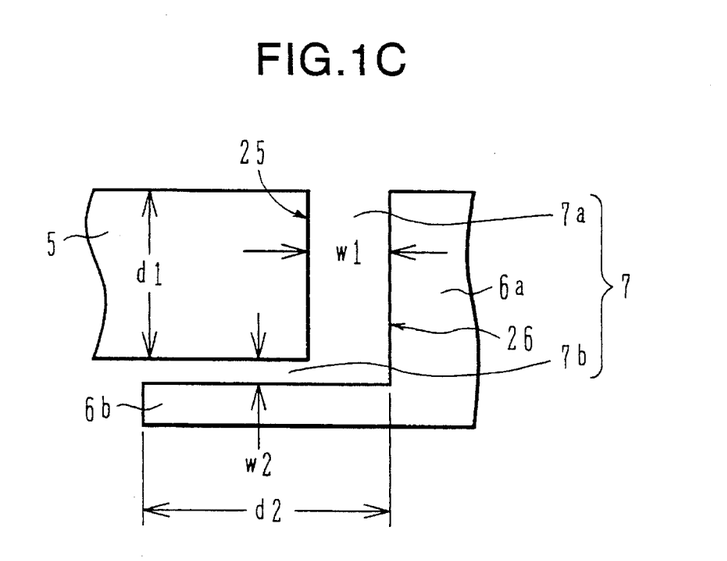
Figure 1D:
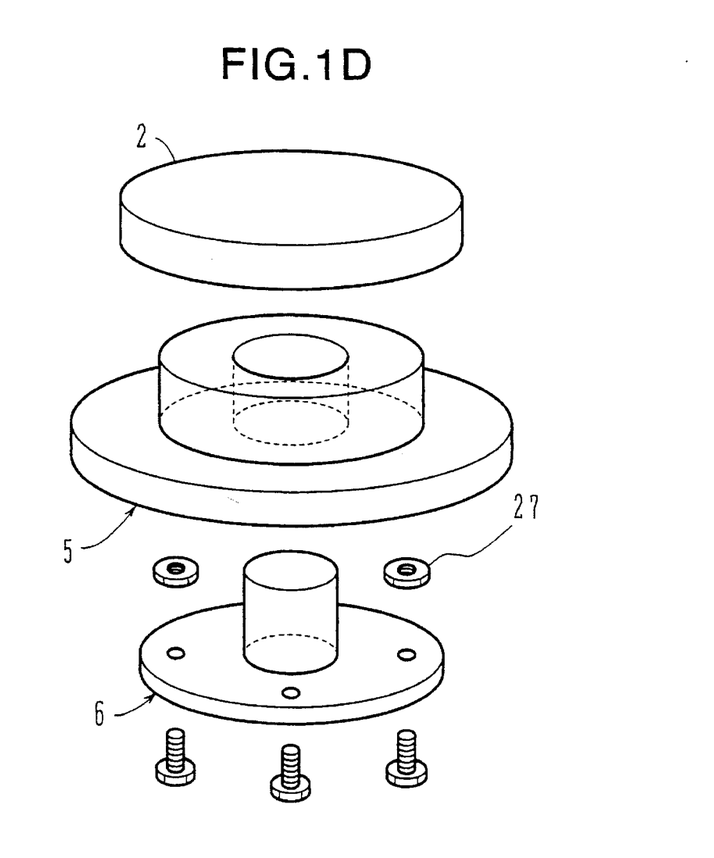
Figure 1E:
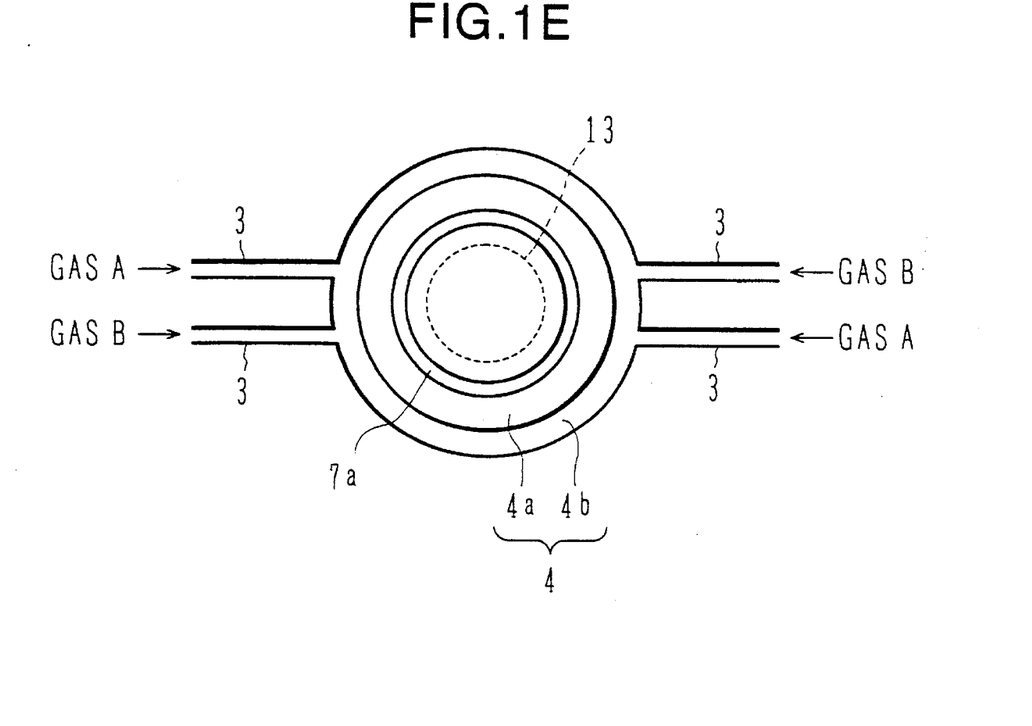
Figure 1F:
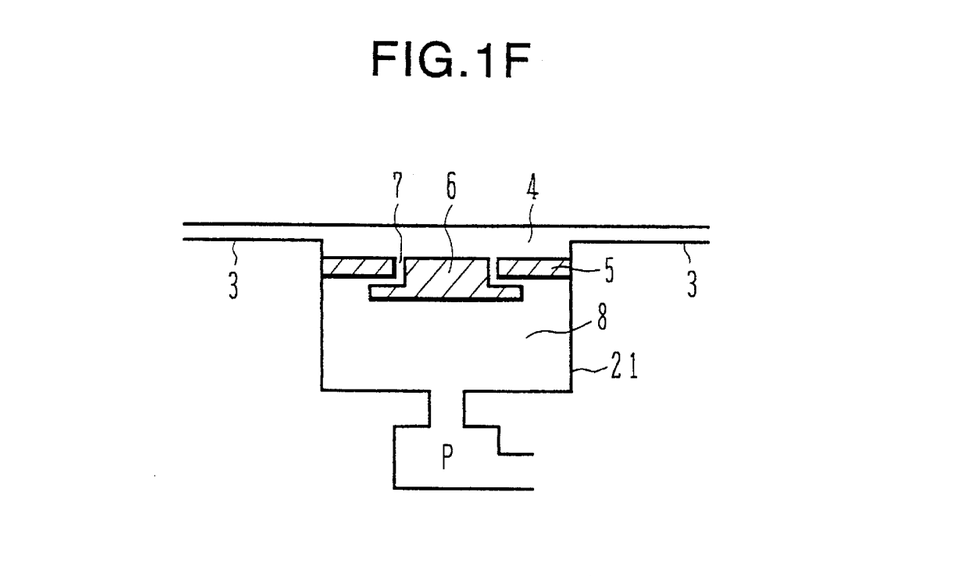

As shown in FIG. 1F, a housing 21 defines an evacuatable hermetic space, with the plasma transmitting window 2 and hermetic seal 23 as shown in FIG. 1A, including the plasma generating chamber 4 and the ashing chamber 8. An evacuation system P is connected to the housing 21 at a bottom portion. The microwave shield 5 and 6 includes an outer annular member 5 and an inner cylindrical member 6, which are made of good electric conductor, i.e. metal such as aluminum, and disposed concentrically. An outer annular member 5 has a cylindrical aperture 25 at a central part, and is fixed in close contact to the housing 21 at a peripheral portion thereof with a plurality of screws. The upper surface of the outer annular member 5 at the peripheral portion is stepped to be thin. The inner cylindrical member 6 includes a cylindrical part 6a and a disc-shaped brim 6b extending outwards from a bottom portion of the cylindrical part 6a. The brim 6b is fixed to the outer annular member 5 through spacers 27 with a plurality of screws.

FIG. 1D is a schematic view illustrating decomposed microwave transmitting window 2, outer annular member 5, spacers 27, and an inner cylindrical member 6.

The structure of the microwave shield 5 and 6 will be described in more detail. FIG. 1B shows a cross section along line IB—IB shown in FIG. 1A. The central portion is occupied by a cylindrical part 6a of the inner cylindrical member 6 and the outer annular member is disposed outside of the cylindrical part 6a through a cylindrical gap 7a.

As shown in FIG. 1B, the outer circumference 26 of the cylindrical part 6a has a smaller diameter than that of the cylindrical opening 25 of the outer annular member 5, to form a cylindrical gap 7a therebetween.

As shown in FIG. 1A, the bottom surface of the outer annular member 5 and the upper surface of the disc-shaped part 6b of the inner cylindrical member 6 are separated by spacers 27 with a width w2, to form in a disc-shaped gap 7b. The inner circumference of the disc-shaped gap 7b is connected to the bottom end of the cylindrical gap 7a, jointly defining a gap (gas passage) 7 of a L-shaped cross section.

As shown In FIG. 1C, a cylindrical gap 7a of a width w1 and a height d1 is formed between the outer circumferential surface 26 of the cylindrical part 6a of the inner cylindrical member 6 and the aperture 25 of the outer annular member 5. A disc-shaped gap 7b of a height w2 and the width d2 is formed between the brim 6b and the bottom surface of the outer annular member 5. It will be apparent that any particles cannot pass through the folded gap 7 without making collision with the gap wall. Further detailed criteria of the gap 7 will be described later.

As shown in FIG. 1A, the plasma generating chamber 4 includes a disc-shaped portion 4a of a height h and ring-shaped portion 4b having a larger height defined by the microwave transmitting window 2 and the stepped surface of the outer annular member 5 at the outer circumference of the disc-shaped portion 4a.

As shown in FIG. 1E, a plurality of gas supply pipes 3 are connected to the ring-shaped portion 4b of the plasma generating chamber 4. As shown in the figure, each two gas passages 3 are connected at the opposing positions of the plasma generating chamber 4. For example, gas A is $O_2$, and gas B is $H_2O$. Each gas is supplied from a pair of opposing gas passages 3. When one species of gas is used, it is preferable to supply the gas at least from the opposing two positions. The gas supplied from the gas passages 3 are uniformed supplied to the disc-shaped portion 4a through the ring-shaped portion 4b.

A cylindrical gap 7a has a circular opening outside of a central portion 13 of the disc-shaped portion 4a. When $O_2$ gas is introduced from the gas passages 3 into the plasma generating chamber 4 at a desired pressure, and microwave is applied thereto, plasma is generated in a region near the window 2 confined by the shield 5 and 6 and radiates plasma emissions. In the plasma, electrons, ions, and radicals are generated. The oxygen radicals generated in the plasma are supplied to the ashing chamber 8 through the cylindrical gap 7a and the disc-shaped gap 7b.

It is preferable that the continuous cylindrical part 6a of the inner cylindrical member 6 shields the plasma in the plasma generating chamber 4. In the plasma, charged particles (ions and electrons) of high energy are generated at high density. Those charged particles directed downward from the plasma are shielded by the central cylindrical part 6a.

When the distance between the microwave transmitting window 2 and the microwave shield 5 and 6 becomes long, it has been experimentally found that the matching of the microwave becomes difficult. When the distance becomes long, reflection wave tends to occur. For example, when a microwave of 2.45 GHz is used, reflection occurs at the distance above about $1/10$ of the microwave wavelength $\lambda$ to be used, i.e. above $\lambda/10$, to render the matching difficult. For making the matching of the microwave easy, the distance between the window 2 and the shield 5 and 6 is preferably at about $\lambda/10$ or below.

When the distance is made short, matching can be easily taken but the capacity for supplying neutral active species is lowered. Then, the ashing rate becomes low. It is preferable to select the distance considering the required ashing rate.

For obtaining a high ashing rate, while preventing reaching of charged particles on the wafer, it seems effective to set the disk-shaped gap 7b to thinner and longer than the cylindrical gap 7a. Charged particles seem to reach the bottom of the cylindrical gap. The height or width w2 of the disk-shaped gap is preferably selected to annihilate the charged particles sufficiently.

In an example using microwave of 2.45 GHz, the diameter of the plasma generating chamber 4 is 110 mm, the width of the ring-shaped portion 4b of the plasma generating chamber 4 is 20 mm, leaving the central disc-shaped portion 4a with a diameter of 70 mm, the height h of the disc-shaped portion 4a of the plasma generating chamber 4 is $1/10$ of the wavelength of the microwave (about 120 mm), $\lambda/10 \approx 12$ mm, the width w1 of the cylindrical gap 7a is $1/6$ of $\lambda$ (20 mm), width w2 of the disc-shaped gap 7b is 2 mm, the height (or length) d1 of the cylindrical gap 7a is 14.5 mm, and the width (or length) d2 of the brim 4b is 26 mm.

In performing ashing using this example ashing apparatus, work gas, such as $O_2$ gas, is introduced from the gas supply pipes 3 into the plasma generating chamber 4, and microwave of 2.45 GHz is applied to generate plasma of $O_2$ gas, etc to generate oxygen radicals. These oxygen radicals are introduced into the ashing chamber 8 through the gap 7, and irradiated onto the resist film coated on the surface of the substrate 9 to be processed and mounted on the susceptor 10. The resist film is ashed by the oxygen radicals.

Comparison of the above-described ashing apparatus with the conventional apparatus shown in FIG. 4 was made by using gases of $O_2+H_2O$, $O_2+N_2$, and $O_2+CF_4$. First, description will be made on the case of using $O_2+H_2O$. The process conditions include:

$O_2$ flow rate: 1350 sccm, $H_2O$ flow rate: 150 sccm, pressure: 1 Torr, microwave power: 1.5 kW, and substrate temperature: 180° C.

The ashing rate in the example apparatus according to the embodiment was 2.6 μm/min., and that of the conventional apparatus of FIG. 4 was 1.0 μm/min. The ashing rate of the example apparatus was above twice the rate of the conventional apparatus.

In the above example, the cylindrical gap 7a formed between the microwave shield members 5 and 6 was set to 20 mm, which is about $\lambda/6$ relative to the microwave wavelength $\lambda$. For confirming whether charged particles reach the substrate 9 in the ashing treatment or not, the temperature of the substrate was changed to obtain activation energy, using $O_2$ gas as the work gas. The obtained activation energy was 0.5 eV. This value coincides with the known value as the activation energy of chemical reaction between oxygen radicals and organic materials (c.f. J. Electrochem. Soc. 130, 2459 (1983)).

When other species than oxygen radicals, e.g. ions and electrons, are incorporated In the reaction, the activation energy will becomes smaller than 0.5 eV, such as 0.4 eV, and 0.3 eV. Thus, it was confirmed that the ashing in the above-described ashing apparatus was damage free, wherein charged particles did not reach the substrate 9.

When with of the gap 7a was increased to 30 mm ($\approx \lambda/4$), the activation energy became about 0.4 eV, indicating that charged particles reached the substrate 9. In this case, if the diameter of the brim 6b of the inner cylindrical member 6 was increased, charged particles could be prevented from reaching the substrate 9, but the ashing rate would be lowered.

Therefore, for performing damage free processing while maintaining a certain level of ashing rate, the cylindrical gap 7a formed in the microwave shield 5 and 6 is preferablely set about $\lambda/5$ or less, where $\lambda$ indicates the wavelength of the microwave to be used.

In the case of using $O_2+N_2$ as the wording gas, the processing conditions were set as follows:

$O_2$ flow rate: 1350 sccm, $N_2$ flow rate; 150 sccm, pressure: 1 Torr, microwave power: 1.50 kW, and substrate temperature: 180° C.

The ashing rate of the above-described example apparatus was 1.2 μm/min while that of the conventional apparatus of FIG. 4 was 0.5 μm/min. The ashing rate of the example apparatus was more than twice tire rate of the conventional apparatus.

In the case of using $O_2+CF_4$ as the working gas, the processing conditions were set as follows:

$O_2$ flow rate: 900 sccm, $CF_4$ flow rate: 100 sccm, pressure: 1 Torr, microwave power: 1.5 kW, and substrate temperature: 40° C.

The microwave transmitting window 2 is formed of a ceramic resistant to fluorine.

The ashing rate of the example apparatus was 4.0 μm/min, while that of the conventional apparatus of FIG. 4 was 2.5 μm/min. The ashing rate of the example apparatus was about 1.75 times as large as that of the conventional apparatus.

In the respective cases, it was found that the ashing rate of the example ashing apparatus was higher than that of the conventional one and still it was possible to perform damage free ashing.

Next, etching of $SiO_2$ using the apparatus as described above will be explained. A mixed gas of $O_2+CF_4$ was used as the working gas, and the process conditions were:

μ wave transmitting window; ceramic $O_2$ flow rate: 100 sccm, $CF_4$ flow rate: 400 sccm, pressure: 1 Torr, microwave power: 1.5 kW, and substrate temperature: 150° C.

The etching rate off SiO$_2$ in the example apparatus was 230 nm/min, while that off the conventional apparatus of FIG. 4 was 150 nm/min. The etching rate of the example apparatus was about 1.5 times as large as that off the conventional one.

Figure 2A:
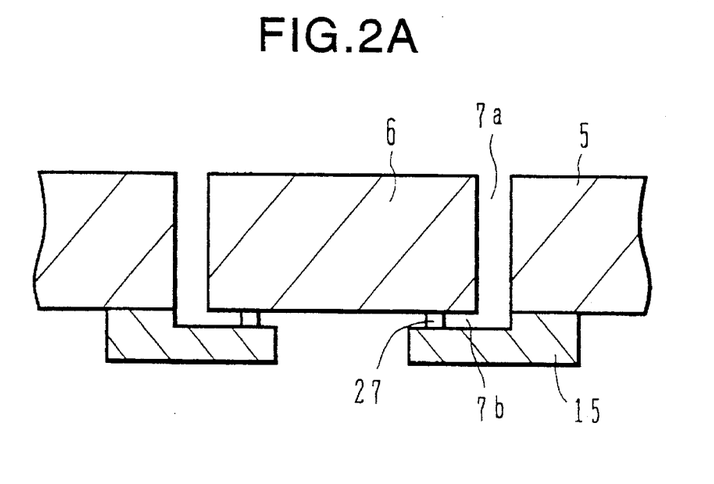
FIGS. 2A to 2C are cross sectional views showing variations of the first embodiment.
Figure 2B:
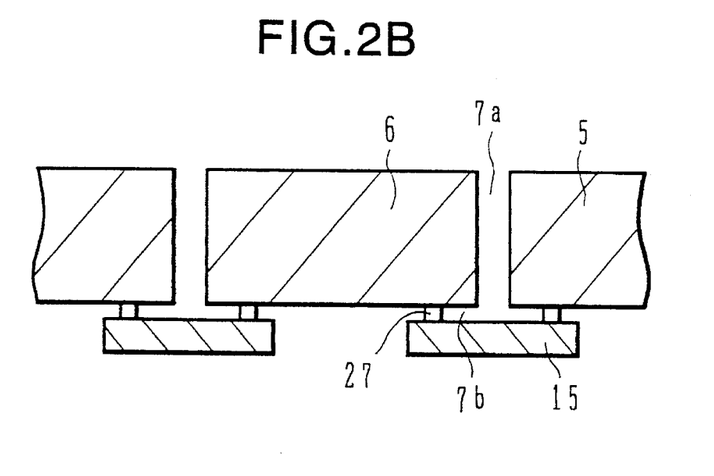
Figure 2C:
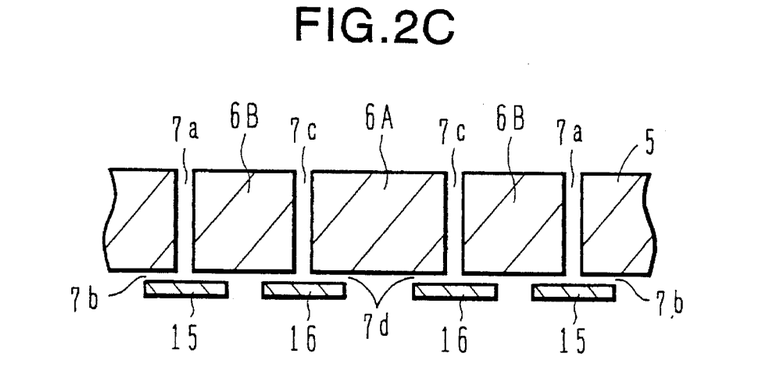

FIGS. 2A to 2C show variations of the ashing apparatus illustrated in FIGS. 1A to 1F.

FIG. 2A shows a structure wherein an outer annular member 5 and inner cylindrical member 6 having a same height are concentrically disposed, and a brim 15 is extended from the bottom of the outer annular member 5 toward inside below the inner cylindrical members 6. The brim 15 make a close contact with the outer annular member 5 and couples to the inner cylindrical member 6 through spacers 27. The outer annular member 5 and the inner cylindrical member 6 forms a cylindrical gap 7a therebetween. The inner cylindrical member 6 and the brim 15 form a disc-shaped gap 7b therebetween. The gaps 7a and 7b form a gas passage having an L-shaped cross section. The outlet of the gas passage is directed toward the center of the chamber.

FIG. 2B shows a structure wherein an outer annular member 5 and an inner cylindrical member 6 having a same height are concentrically disposed, and an annular brim 15 is disposed therebelow with a gap therebetween. The brim 15 is coupled to the outer annular member 5 and the inner cylindrical member 6 through spacers 27, forming annular disc-shaped gap 7b with an inner and an outer outlets, therebetween. The lower end of the cylindrical gap 7a is connected to approximately center of the annular disc-shaped gap 7b to form a gas passages of an inverted T-shaped, or upside-down T-shaped cross section.

FIG. 2C shows a structure wherein, in addition to the structure of FIG. 2B, another gas passage is formed through the inner cylindrical member 6. An inner cylindrical member 6 is divided into a central cylindrical member 6A and an outer cylindrical member 6B, to form a cylindrical gap 7c therebetween. Below the central cylindrical member 6A and the outer cylindrical member 6B, an annular disc-shaped brim 16 is disposed with a gap therefrom, to form an annular disc-shaped gap 7d. The gaps 7c and 7d form gas passages of an inverted T-shaped cross section. In this case, two cylindrical gas passages are formed.

The, number of gas passages, and the cross sectional shapes of the gas passages are not limited to the above. Various gas passages can be made using cylindrical gas passage and an annular or disc-shaped gas passage which is directed almost orthogonal to the axis of the cylindrical gas passage. Also, looped gaps of various shape other than circular gap, such as ellipsoidal gap, can be employed.

Figure 3A:
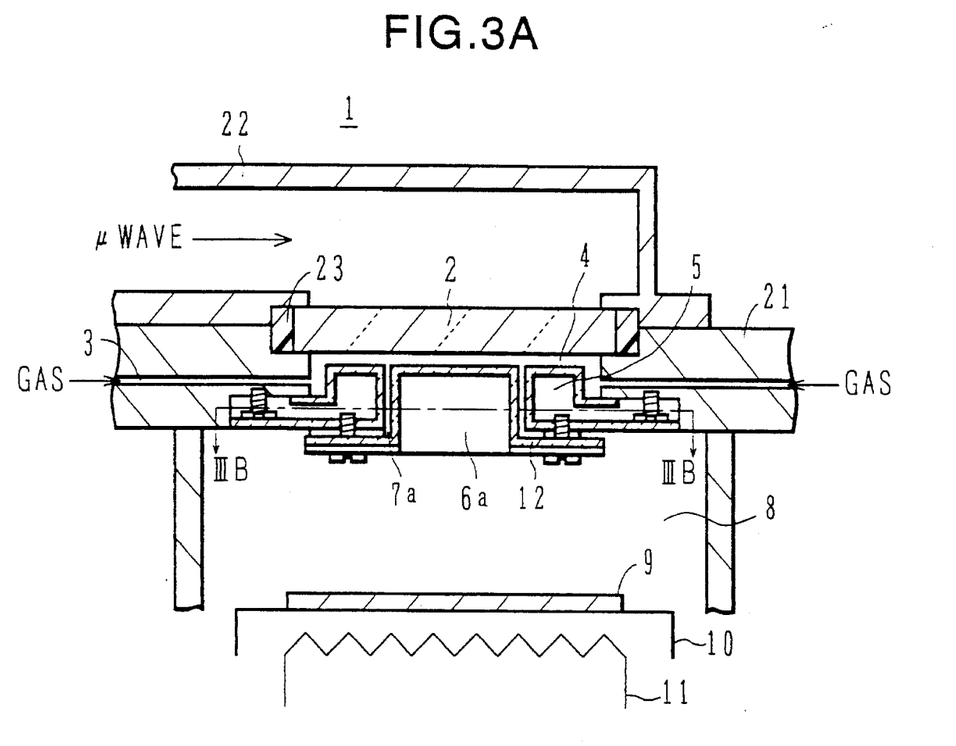
FIGS. 3A and 3B are cross sectional views showing an ashing apparatus according to the second embodiment of this invention, with quartz covers.
Figure 3B:
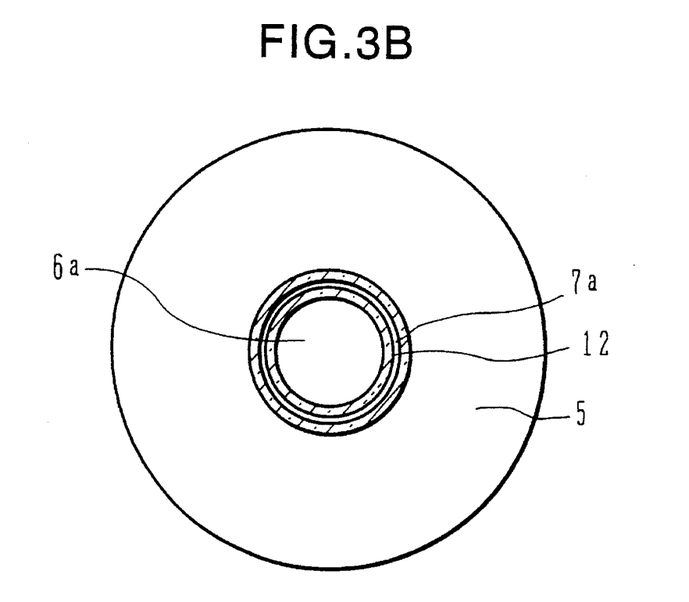

FIGS. 3A and 3B illustrate an ashing apparatus according to another embodiment of this invention. Similar to the foregoing embodiment, the ashing apparatus comprises, a microwave introduction chamber 1 for introducing microwave and transmitting microwave through a microwave transmitting window 2, a plasma generating chamber 4 For generating plasma of a gas introduced From gas supply pipes 3, the microwave transmitting window 2 separating the microwave introduction chamber 1 and the plasma generating chamber 4, an ashing chamber 8 containing a susceptor 10 for mounting a substrate 9 to be processed, and microwave shield 5 and 6 for separating the ashing chamber 8 and the plasma generating chamber 4, shielding the microwave and charged particles, and allowing passage of neutral particles such as neutral reactive species (radicals).

Here, the surface of the microwave shield 5 and 6 exposed to the plasma is covered with quartz layers 12. Further, the surface of microwave shield 5, 6 exposed to the gap 7 is also coated with quartz layers 12. The whole bottom surface of the outer annular member 5 is also covered with the quartz layers 12.

Although FIGS. 3A and 3B show that the surfaces of the microwave shield 5 and 6 exposed in the plasma generating chamber 4 are covered with quartz layers 12, smaller but similar effects can be obtained by coating part of the exposed surfaces of the microwave shield 5 and 6, for example, by shielding the central portion of the upper surface.

When a fluorine-containing gas is used as the work gas, the quartz layer may be etched. Thus, this structure is particularly useful well the work gas contain no fluorine. The quartz layer serves to reduce the annihilation rate of oxygen radicals at the surface. It may be as thin as several tens microns. When the quartz layer is thin enough, the design of the microwave shield 5, 6 may be almost the same as that of the foregoing embodiment. It is preferable to select the height between the microwave transmitting window 2 and the central cylindrical member 6a or the microwave shield to be at $\lambda/10$ of the microwave wavelength $\lambda$ or less for making the matching of the microwave easy. Also, it is preferable to select the cylindrical gap 7a to be $\lambda/5$ or smaller for preventing charged particles to reach the substrate 9. For example, the height of microwave generating chamber 4 in a central portion is set at 12 mm and the cylindrical gap 7a is set at 20 mm. The quartz layer can be manufactured separately or can be sputtered on the aluminum parts.

In an example, the thickness of the quartz layer is set at 2 mm. When the quartz layer is thick, the microwave transmitting character of the quartz can be considered.

Ashing characteristics of the ashing apparatus shown in FIGS. 3A and 3B were measured in the above-mentioned example structure using $O_2+H_2O$ and $O_2+N_2$ as working gases.

In the case of using $O_2+H_2O$ as the wording gas, process conditions were set as follows:

O$_2$ flow rate: 1350 sccm,

N$_2$ flow rate: 150 sccm, p1 pressure: 1 Torr, microwave power: 1.5 kW, and substrate temperature: 180° C.

The ashing rate of the example apparatus according to this embodiment was 3.5 μm/min, while that of the example apparatus of the foregoing embodiment was 2.6 μm/min, indicating that the present embodiment can exhibit a higher ashing rate.

In the case of using $O_2+N_2$ as the working gas, the process conditions were set as follows:

O$_2$ flow rate: 1350 sccm,

N$_2$ flow rate: 150 sccm, pressure: 1 Torr, microwave power: 1.5 kW, and substrate temperature: 180° C.

The ashing rate of the example of this embodiment was 1.6 μm/min, while that of the apparatus of the foregoing embodiment was 1.2 μm/min, indicating that the present embodiment can exhibit a higher ashing rate.

The ashing apparatus of this embodiment with quartz covers 12 is superior to the foregoing embodiment in the point that the annihilation of oxygen radicals at the surface is suppressed by the existence of quartz layer on the surface of the microwave shield 5 and 6. Thus, a higher ashing rate can be obtained In this embodiment, even compared to the first embodiment described earlier.

In the above embodiments, the central portion of the plasma generating chamber 4 coincides with the portion where the electric field of the standing microwave has larger amplitude and plasma density becomes highest. When other shapes than circular shape are employed as the horizontal cross sectional shape of the plasma generating chamber, the central area of high plasma density can be changed accordingly.

A loop-shaped gap surrounding the area of high plasma density can be employed In place of the above-described annular or circular gap. Although aluminum is used as the material for constituting the mechanical components or the microwave shield, plasma generating chamber, and the processing chamber, other metals or conducting materials can also be used. A microwave transmitting window can also be made of ceramics as well as quartz.

The ashing apparatus as described above can be combined with another etching apparatus rot etching an aluminum wiring layer, for example, by using an etching gas $Cl_2$+$BCl_2$+$SiCl_4$. In such a ease, an evacuatable transport chamber can be coupled to these apparatuses to realize a system in which substrates can be transferred from one apparatus to another without exposing them to external atmosphere.

Although description has been made referring to the preferred embodiments of this invention, the invention is not limited thereto. For example, various changes, substitutions, alterations, improvements, or combinations can be made within the scope of the appended claims.

I claim:

1. An apparatus for performing plasma downstream processing comprising:

a microwave introduction chamber defined by a wall having a microwave transmitting window formed of a microwave transmissive material at a part thereof;

a plasma generating chamber facing to said microwave introduction chamber through said microwave transmitting window and having a conductive microwave shield disposed generally parallel to said microwave transmitting window, to define a plasma generating space, said microwave shield including a central member which is formed of a continuous conductor and an outer member disposed outside the central member through a gap which has a folded cross sectional shape in a plane including a central normal to the microwave transmitting window; and an evacuatable processing chamber disposed adjacent to said plasma generating chamber through said microwave shield.

2. An apparatus according to claim 1, wherein said central member has a cylindrical outer side surface, said outer member has a cylindrical inner side surface facing to said cylindrical outer side surface interposing said gap, said gap having a cylindrical shape, and said microwave shield further comprises a disc-shaped member disposed to face a bottom surface of one of said central member and said outer member through a disc-shaped gap.

3. An apparatus according to claim 2, wherein said disc-shaped member is contiguous to a bottom of said central member, extends along a bottom of said outer member and is coupled to the bottom the outer member through spacers.

4. An apparatus according to claim 2, wherein said disc-shaped member is contiguous from a bottom of said outer member, extends along a bottom of said central member and is coupled to the bottom of the central member through spacers.

5. An apparatus according to claim 2, wherein said central member is disposed to face said microwave transmitting window with a gap selected at about 1/10 of the wavelength $\lambda$ of the microwave or less.

6. An apparatus according to claim 2, wherein said cylindrical gap has a width of 1/5 or less of a wavelength $\lambda$ of the microwave.

7. An apparatus according to claim 2, further comprising first quartz layers covering the upper surface of said central member and side surfaces of said cylindrical gap.

8. An apparatus according to claim 7, further comprising second quartz layers covering an upper surface of said outer member in an inner area, and a bottom surface of said outer member.

* * * * *